United States Patent
Seo (10) Patent No.: US 10,819,324 B2
(45) Date of Patent: Oct. 27, 2020

(54) SEMICONDUCTOR APPARATUS INCLUDING CLOCK PATHS AND SEMICONDUCTOR SYSTEM INCLUDING THE SEMICONDUCTOR APPARATUS

(71) Applicant: SK hynix Inc., Icheon-si (KR)

(72) Inventor: Young Suk Seo, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/444,799

(22) Filed: Jun. 18, 2019

(65) Prior Publication Data

US 2020/0153421 A1 May 14, 2020

(30) Foreign Application Priority Data

Nov. 8, 2018 (KR) .......................... 10-2018-0136577

(51) Int. Cl.

| H03K 5/13 | (2014.01) |
| H03L 7/099 | (2006.01) |
| H03K 21/38 | (2006.01) |
| G11C 17/18 | (2006.01) |
| G06F 1/06 | (2006.01) |
| G11C 17/16 | (2006.01) |
| H03K 5/00 | (2006.01) |

(52) U.S. Cl.
CPC ................ *H03K 5/13* (2013.01); *G06F 1/06* (2013.01); *G11C 17/16* (2013.01); *G11C 17/18* (2013.01); *H03K 21/38* (2013.01); *H03L 7/099* (2013.01); *H03K 2005/00078* (2013.01)

(58) Field of Classification Search
None
See application file for complete search history.

(56) References Cited

U.S. PATENT DOCUMENTS

| 8,228,105 B2 * | 7/2012 | McLeod | H03K 5/1565 327/172 |
| 8,564,348 B1 * | 10/2013 | Staszewski | H03K 5/131 327/149 |
| 9,571,106 B2 | 2/2017 | Seo et al. | |

FOREIGN PATENT DOCUMENTS

KR  1020150141018 A  12/2015

* cited by examiner

*Primary Examiner* — Jeffery S Zweizig
(74) *Attorney, Agent, or Firm* — William Park & Associates Ltd.

(57) ABSTRACT

A semiconductor apparatus includes a first clock path which generates a first output clock signal by delaying a first phase clock signal, and a second clock path which generates a second output clock signal by delaying a second phase clock signal based on a delay compensation signal. The oscillating path generation circuit forms oscillating paths with the first clock path and the second clock path. The delay information generation circuit generates a delay compensation signal based on oscillating signals generated by forming the oscillating paths.

22 Claims, 5 Drawing Sheets

SEMICONDUCTOR APPARATUS INCLUDING CLOCK PATHS AND SEMICONDUCTOR SYSTEM INCLUDING THE SEMICONDUCTOR APPARATUS

CROSS-REFERENCES TO RELATED APPLICATION

The present application claims priority under 35 U.S.C. § 119(a) to Korean application number 10-2018-0136577, filed on Nov. 8, 2018, in the Korean Intellectual Property Office, which is incorporated herein by reference in its entirety.

BACKGROUND

1. Technical Field

Various embodiments generally relate to an integrated circuit technology, and more particularly, to a clock generation circuit, and a semiconductor apparatus and system including the clock generation circuit.

2. Related Art

An electronic device may include many electronic components. Among the electronic components, a computer system may include a large number of semiconductor apparatuses composed of semiconductors. The semiconductor apparatuses constituting the computer system may communicate with one another while transferring and receiving clock signals and data. The semiconductor apparatuses may operate in synchronization with the clock signal. The clock signal may be generated from an oscillator, a phase locked loop (PLL) or the like.

The semiconductor apparatuses may receive a system clock signal to perform various operations, and generate an internal clock signal from the system clock signal in order to use the system clock signal therein. The internal clock signal may be generated by dividing the frequency of the system clock signal, or generated by increasing the frequency of an external clock signal.

SUMMARY

In an embodiment, a semiconductor apparatus may include a first clock path, a second clock path, an oscillating path generation circuit, and a delay information generation circuit. The first clock path may be configured to generate a first output clock signal by delaying a first phase clock signal. The second clock path may be configured to generate a second output clock signal by delaying a second phase clock signal based on a delay compensation signal. The oscillating path generation circuit may be configured to form an oscillating path with the first clock path to generate an oscillating signal, and form the oscillating path with the second clock path to generate the oscillating signal. The delay information generation circuit may be configured to generate the delay compensation signal based on the oscillating signal.

In an embodiment, there is provided an operating method of a semiconductor system which includes a semiconductor apparatus including a first clock path configured to generate a first output clock signal by delaying a first phase clock signal and a second clock path configured to generate a second output clock signal by delaying a second phase clock signal. The operating method may include forming a first oscillating path with the first clock path, and generating a first delay information signal corresponding to a delay amount of the first oscillating path. The operating method include forming a second oscillating path with the second clock path, and generating a second delay information signal corresponding to a delay amount of the second oscillating path. The operating method may include generating a delay compensation signal by performing an operation on the first and second delay information signals. And the operating method may include setting a delay amount of the second clock path based on the delay compensation signal.

In an embodiment, a semiconductor system may include and external device and a semiconductor apparatus. The external device may be configured to generate a system clock signal. The semiconductor apparatus may be configured to receive the system clock signal from the external device. The semiconductor apparatus comprises a multi-phase clock generation circuit, a first clock path, a second clock path, and a clock path monitoring circuit. The multi-phase clock generation circuit configured to generate a first phase clock signal and a second phase clock signal based on the system clock signal. The first clock path may be configured to generate the first output clock signal by delaying the first phase clock signal. The second clock path may be configured to generate a second output clock signal by delaying the second phase clock signal based on a delay compensation signal. The clock path monitoring circuit may be configured to form an oscillating path with the first clock path to generate a first delay information signal, form the oscillating path with the second clock path to generate a second delay information signal, and generate the delay compensation signal based on the first and second delay information signals.

DETAILED DESCRIPTION

Figure 1:
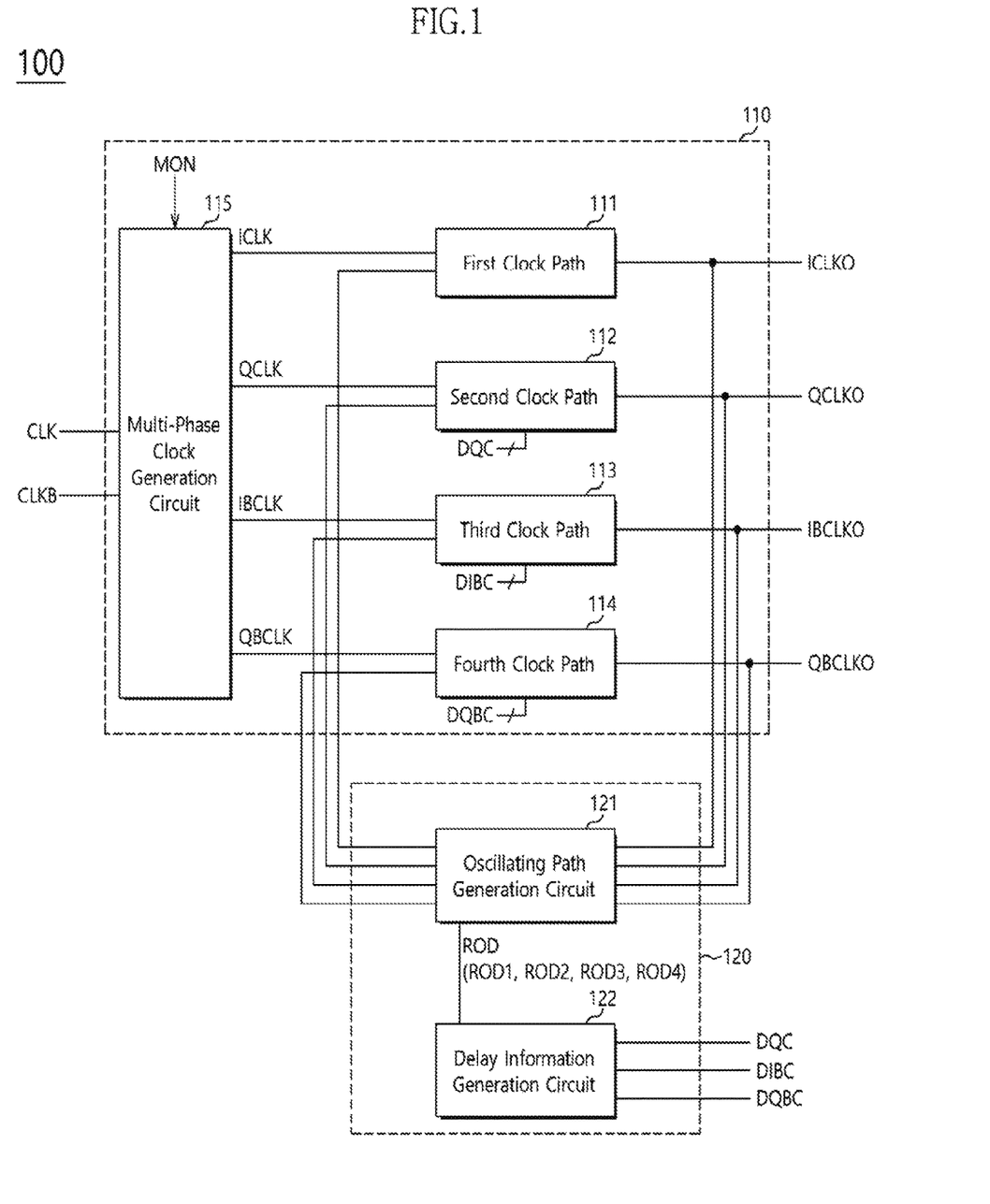
FIG. 1 illustrates a configuration of a semiconductor apparatus in accordance with an embodiment.

FIG. 1 illustrates a configuration of a semiconductor apparatus 100 in accordance with an embodiment. In FIG. 1, the semiconductor apparatus 100 may receive a system clock signal CLK from an external device (not illustrated) and generate an internal clock signal. In an embodiment, the semiconductor apparatus 100 may receive a system clock signal CLK from an external of the semiconductor apparatus 100 and generate the internal clock signal. The internal clock signal may include a plurality of clock signals having different phases. The semiconductor apparatus 100 may include a plurality of clock paths to generate the internal clock signal. The semiconductor apparatus 100 may monitor delay times and/or delay amounts of the plurality of clock paths, and set the delay times and/or delay amounts of the plurality of clock paths such that the plurality of clock paths have substantially the same delay times and/or delay amounts. Based on one clock path of the plurality of clock paths, the semiconductor apparatus 100 may change the delay times and/or delay amounts of the other clock paths.

In FIG. 1, the semiconductor apparatus 100 may include a clock generation circuit 110 and a clock path monitoring circuit 120. The clock generation circuit 110 may generate a first output clock signal ICLKO from a first phase clock signal ICLK, and generate a second output clock signal QCLKO from a second phase clock signal QCLK. The clock generation circuit 110 may generate a third output clock signal IBCLKO from a third phase clock signal IBCLK, and generate a fourth output clock signal QBCLKO from a fourth phase clock signal QBCLK. The clock generation circuit 110 may include a first clock path 111, a second clock path 112, a third clock path 113 and a fourth clock path 114. The first clock path 111 may receive the first phase clock signal ICLK. The first clock path 111 may generate the first output clock signal ICLKO by delaying the first phase clock signal ICLK. The second clock path 112 may receive the second phase clock signal QCLK. The second clock path 112 may generate the second output clock signal QCLKO by delaying the second phase clock signal QCLK. The delay time and/or delay amount of the second clock path 112 may be adjusted and/or changed based on a first delay compensation signal DQC. The third clock path 113 may receive the third phase clock signal IBCLK. The third clock path 113 may generate the third output clock signal IBCLKO by delaying the third phase clock signal IBCLK. The delay time and/or delay amount of the third clock path 113 may be adjusted and/or changed based on a second delay compensation signal DIBC. The fourth clock path 114 may receive the fourth phase clock signal QBCLK. The fourth clock path 114 may generate the fourth output clock signal QBCLKO by delaying the fourth phase clock signal QBCLK. The delay time and/or delay amount of the fourth clock path 114 may be adjusted and/or changed based on a third delay compensation signal DQBC.

The first to fourth phase clock signals ICLK, QCLK, IBCLK and QBCLK may have a phase difference corresponding to a unit phase therebetween. For example, the first phase clock signal ICLK may have a phase that leads the second phase clock signal QCLK by the unit phase, the second phase clock signal QCLK may have a phase that leads the third phase clock signal IBCLK by the unit phase, and the third phase clock signal IBCLK may have a phase that leads the fourth phase clock signal QBCLK by the unit phase. The unit phase may correspond to ¼ cycle of each of the first to fourth phase clock signals ICLK, QCLK, IBCLK and QBCLK, i.e. 90 degrees, for example. FIG. 1 illustrates four clock paths and fourth phase clock signals, but the numbers of clock paths and phase clock signals are not limited thereto. In an embodiment, eight clock paths and eight phase clock signals may be provided, and the eight phase clock signals may have a phase difference of 45 degrees therebetween.

The clock path monitoring circuit 120 may monitor the delay times and/or delay amounts of the first to fourth clock paths 111 to 114. The clock path monitoring circuit 120 may be coupled to the first to fourth clock paths 111 to 114 to form oscillating paths with the first to fourth clock paths 111 to 114, respectively. The clock path monitoring circuit 120 may measure the delay times and/or delay amounts of the first to fourth clock paths 111 to 114 based on oscillating signals ROD generated from the respective oscillating paths.

The clock path monitoring circuit 120 may sequentially form the oscillating paths with the first to fourth clock paths 111 to 114. The clock path monitoring circuit 120 may adjust the delay times and/or delay amounts of one or more of the first to fourth clock paths 111 to 114 according to the measurement and/or monitoring results. The first clock path 111 may serve as a reference clock path. The clock path monitoring circuit 120 may set the delay times and/or delay amounts of the second to fourth clock paths 112 to 114 such that the second to fourth clock paths 112 to 114 can have substantially the same delay time and/or delay amount as the first clock path 111.

The clock path monitoring circuit 120 may include an oscillating path generation circuit 121 and a delay information generation circuit 122. The oscillating path generation circuit 121 may be coupled to the first to fourth clock paths 111 to 114. The oscillating path generation circuit 121 may form the oscillating paths including the first to fourth clock paths 111 to 114. The oscillating path generation circuit 121 may form the oscillating paths with the first to fourth clock paths 111 to 114 to generate the oscillating signals ROD. The oscillating path generation circuit 121 may be coupled to the first clock path 111 and form a first oscillating path including the first clock path 111. The oscillating path generation circuit 121 may be coupled to the second clock path 112 and form a second oscillating path including the second clock path 112. The oscillating path generation circuit 121 may be coupled to a third clock path 113 and form the third oscillating path including the third clock path 113. The oscillating path generation circuit 121 may be coupled to the fourth clock path 114 and form a fourth oscillating path including the fourth clock path 114.

The oscillating path generation circuit 121 may generate a first oscillating signal ROD1 through the first oscillating path. The oscillating path generation circuit 121 may be coupled to an output terminal of the first clock path 111, receive an output of the first clock path 111, and generate the first oscillating signal ROD1. The oscillating path generation circuit 121 may feed back the first oscillating signal ROD1 to an input terminal of the first clock path 111. The period and/or cycle of the first oscillating signal ROD1 may correspond to the delay amount of the first clock path 111. The oscillating path generation circuit 121 may generate a second oscillating signal ROD2 through the second oscillating path. The oscillating path generation circuit 121 may be coupled to an output terminal of the second clock path 112, receive an output of the second clock path 112, and generate the second oscillating signal ROD2. The oscillating path generation circuit 121 may feed back the second oscillating signal ROD2 to an input terminal of the second clock path 112. The period and/or cycle of the second oscillating signal ROD2 may correspond to the delay amount of the second clock path 112.

The oscillating path generation circuit 121 may generate a third oscillating signal ROD3 through the third oscillating path. The oscillating path generation circuit 121 may be coupled to an output terminal of the third clock path 113, receive an output of the third clock path 113, and generate the third oscillating signal ROD3. The oscillating path generation circuit 121 may feed back the third oscillating signal ROD3 to an input terminal of the third clock path 113. The period and/or cycle of the third oscillating signal ROD3 may correspond to the delay amount of the third clock path 113. The oscillating path generation circuit 121 may generate a fourth oscillating signal ROD4 through the fourth oscillating path. The oscillating path generation circuit 121 may be coupled to an output terminal of the fourth clock path 114, receive an output of the fourth clock path 114, and generate the fourth oscillating signal ROD4. The oscillating path generation circuit 121 may feed back the fourth oscillating signal ROD4 to an input terminal of the fourth clock path 114. The period and/or cycle of the fourth oscillating signal ROD4 may correspond to the delay amount of the fourth clock path 114.

The delay information generation circuit 122 may receive the oscillating signals ROD outputted from the oscillating path generation circuit 121. The delay information generation circuit 122 may generate delay information signals based on the oscillating signals ROD. The delay information generation circuit 122 may generate the delay information signals corresponding to the first to fourth oscillating signals ROD1 to ROD4 based on the first to fourth oscillating signals ROD1 to ROD4, respectively. The delay information signals may include respective pieces of information corresponding to the delay times and/or delay amounts of the first to fourth clock paths 111 to 114. For example, the delay information signals may include a first delay information signal corresponding to the delay amount of the first clock path 111, a second delay information signal corresponding to the delay amount of the second clock path 112, a third delay information signal corresponding to the delay amount of the third clock path 113, and a fourth delay information signal corresponding to the delay amount of the fourth clock path 114.

The first clock path 111 may serve as a reference clock path. The first delay information signal may serve as a reference delay information signal. The delay information generation circuit 122 may generate the first delay compensation signal DQC based on the first delay information signal and the second delay information signal. The delay information generation circuit 122 may generate the first delay compensation signal DQC by performing an operation on the first and second delay information signals. The first delay compensation signal DQC may have a code value corresponding to a difference between the first and second delay information signals. The delay information generation circuit 122 may generate the second delay compensation signal DIBC based on the first delay information signal and the third delay information signal. The delay information generation circuit 122 may generate the second delay compensation signal DIBC by performing an operation on the first and third delay information signals. The second delay compensation signal DIBC may have a code value corresponding to a difference between the first and third delay information signals. The delay information generation circuit 122 may generate the third delay compensation signal DQBC based on the first delay information signal and the fourth delay information signal. The delay information generation circuit 122 may generate the third delay compensation signal DQBC by performing an operation on the first and fourth delay information signals. The third delay compensation signal DQBC may have a code value corresponding to a difference between the first and fourth delay information signals.

The delay information generation circuit 122 may provide the first delay compensation signal DQC to the second clock path 112 in order to adjust the delay amount of the second clock path 112 and to set the delay time of the second clock path 112. Because the first delay compensation signal DQC is generated based on the difference between the first and second delay information signals, the delay amount of the second clock path 112, adjusted by the first delay compensation signal DQC, may become substantially equal to the delay amount of the first clock path 111. The delay information generation circuit 122 may provide the second delay compensation signal QIBC to the third clock path 113 in order to adjust the delay amount of the third clock path 113 and to set the delay time of the third clock path 113. Because the second delay compensation signal DIBC is generated based on a difference between the first and third delay information signals, the delay amount of the third clock path 113, adjusted by the second delay compensation signal DIBC, may become substantially equal to the delay amount of the first clock path 111. The delay information generation circuit 122 may provide the third delay compensation signal DQBC to the fourth clock path 114 in order to adjust the delay amount of the fourth clock path 114 and to set the delay time of the fourth clock path 114. Because the third delay compensation signal DQBC is generated based on a difference between the first and fourth delay information signals, the delay amount of the fourth clock path 114, adjusted by the third delay compensation signal DQBC, may become substantially equal to the delay amount of the first clock path 111.

In FIG. 1, the clock generation circuit 110 may further include a multi-phase clock generation circuit 115. The multi-phase clock generation circuit 115 may receive the system clock signal CLK from an external device. The system clock signal CLK may be inputted as a single ended signal, or inputted as a differential signal with the complementary signal CLKB. The multi-phase clock generation circuit 115 may generate the first to fourth phase clock signals ICLK, QCLK, IBCLK and QBCLK by adjusting the phase of the system clock signal CLK or converting the frequency of the system clock signal CLK. For example, the multi-phase clock generation circuit 115 may divide the frequency of the system clock signal CLK, and generate the first to fourth phase clock signals ICLK, QCLK, IBCLK and QBCLK based on the divided clock signal. That is, the first to fourth phase clock signals ICLK, QCLK, IBCLK and QBCLK may have a lower frequency than the system clock signal CLK.

The multi-phase clock generation circuit 115 may receive a monitoring signal MON. The multi-phase clock generation circuit 115 may fix the first to fourth phase clock signals ICLK, QCLK, IBCLK and QBCLK to a specific level based on the monitoring signal MON. For example, when the monitoring signal MON is enabled, the multi-phase clock generation circuit 115 may output a level signal having a logic high level to the first to fourth clock paths 111 to 114. The monitoring signal MON may be enabled in a monitoring operation mode in which the semiconductor apparatus 100 monitors the delay times and/or delay amounts of the first to fourth clock paths 111 to 114.

Figure 2:
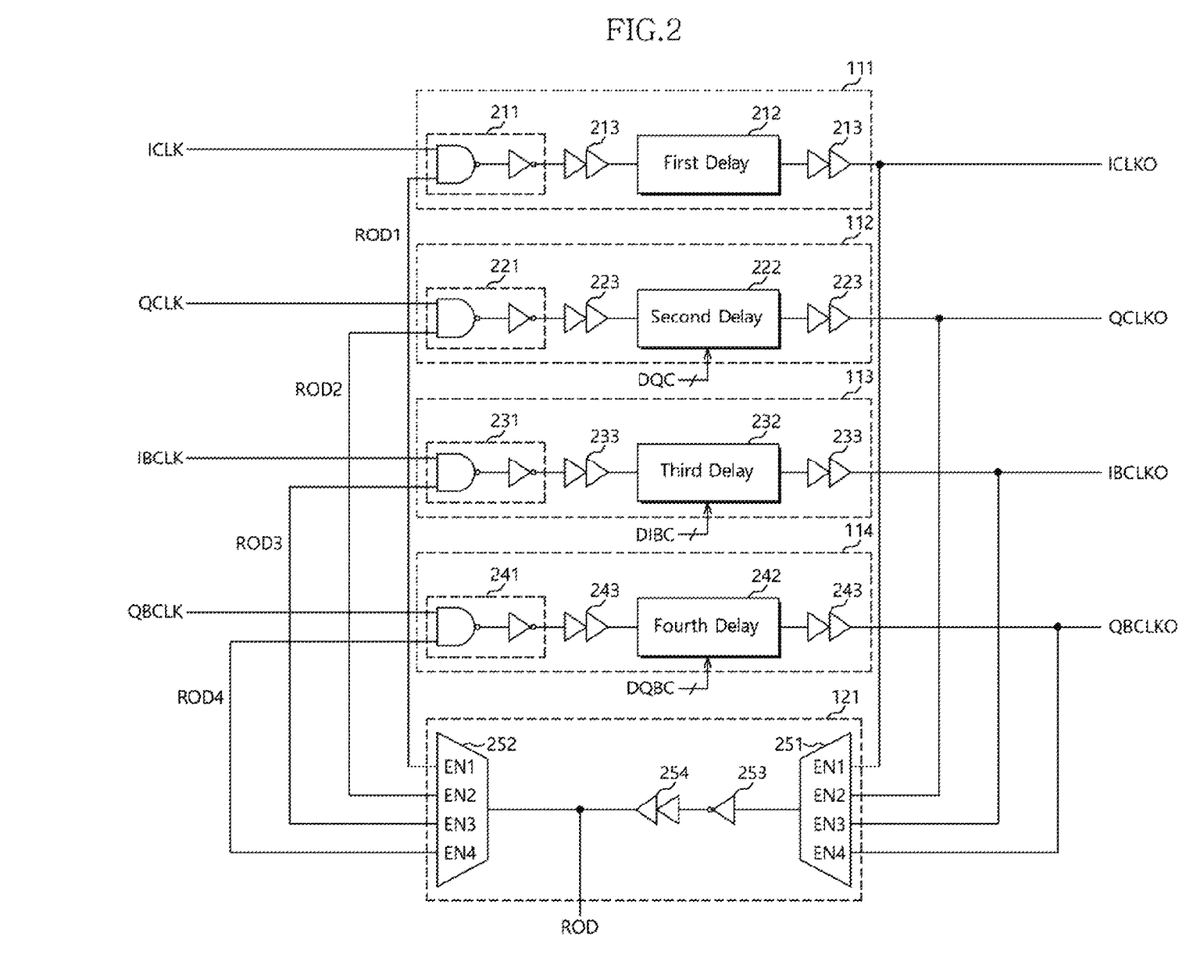
FIG. 2 illustrates configurations of first to fourth clock paths and an oscillating path generation circuit in FIG. 1 and coupling relations between the first to fourth clock paths and the oscillating path generation circuit.

FIG. 2 illustrates the configurations of the first to fourth clock paths 111 to 114 and the oscillating path generation circuit 121 in FIG. 1 and the coupling relations between the first to fourth clock paths 111 to 114 and the oscillating path generation circuit 121. Referring to FIG. 2, the first clock path 111 may include a first oscillating controller 211 and a first delay 212. The first oscillating controller 211 may receive the first phase clock signal ICLK and the oscillating signal ROD. The oscillating signal received by the first oscillating controller 211 may be the first oscillating signal ROD1. The first oscillating controller 211 may output the first oscillating signal ROD1 in the monitoring operation mode of the semiconductor apparatus 100, and output the first phase clock signal ICLK in a normal operation mode of the semiconductor apparatus 100. The normal operation mode may include any operation modes excluding the monitoring operation mode. The first delay 212 may generate the first output clock signal ICLKO by delaying the output of the first oscillating controller 211. The first delay 212 may have a delay time set to a reference time. The first delay 212 may be a fixed delay. The first clock path 111 may further include a buffer 213 configured to buffer the output of the first oscillating controller 211 and an output of the fixed delay 212. The first oscillating controller 211 may be configured to perform AND and inversion operations and may include, for example but not limited to, a NAND gate configured to receive the first phase clock signal ICLK and the first oscillating signal ROD1 and an inverter configured to invert an output of the NAND gate.

The second clock path 112 may include a second oscillating controller 221 and a second delay 222. The second oscillating controller 221 may receive the second phase clock signal QCLK and the oscillating signal ROD. The oscillating signal received by the second oscillating controller 221 may be the second oscillating signal ROD2. The second oscillating controller 221 may output the second oscillating signal ROD2 in the monitoring operation mode of the semiconductor apparatus 100, and output the second phase clock signal QCLK in the normal operation mode of the semiconductor apparatus 100. The second delay 222 may generate the second output clock signal QCLKO by delaying the output of the second oscillating controller 221. The second delay 222 may receive the first delay compensation signal DQC. The second delay 222 may be a variable delay. The delay time and/or delay amount of the second delay 222 may be adjusted based on the first delay compensation signal DQC. The second clock path 112 may further include a buffer 223 configured to buffer the output of the second oscillating controller 221 and an output of the second delay 222. The second oscillating controller 221 may be configured to perform NAND and inversion operations and may include, for example but not limited to, a NAND gate configured to receive the second phase clock signal QCLK and the second oscillating signal ROD2 and an inverter configured to invert an output of the NAND gate.

The third clock path 113 may include a third oscillating controller 231 and a third delay 232. The third oscillating controller 231 may receive the third phase clock signal IBCLK and the oscillating signal ROD. The oscillating signal received by the third oscillating controller 231 may be the third oscillating signal ROD3. The third oscillating controller 231 may output the third oscillating signal ROD3 in the monitoring operation mode of the semiconductor apparatus 100, and output the third phase clock signal IBCLK in the normal operation mode of the semiconductor apparatus 100. The third delay 232 may generate the third output clock signal IBCLKO by delaying the output of the third oscillating controller 231. The third delay 232 may receive the second delay compensation signal DIBC. The third delay 232 may be a variable delay. The delay time and/or delay amount of the variable delay 232 may be adjusted based on the second delay compensation signal DIBC. The third clock path 113 may further include a buffer 233 configured to buffer the output of the third oscillating controller 231 and an output of the third delay 232. The third oscillating controller 231 may be configured to perform NAND and inversion operations and may include, for example but not limited to, a NAND gate configured to receive the third phase clock signal IBCLK and the third oscillating signal ROD3 and an inverter configured to invert an output of the NAND gate.

The fourth clock path 114 may include a fourth oscillating controller 241 and a fourth delay 242. The fourth oscillating controller 241 may receive the fourth phase clock signal QBCLK and the oscillating signal ROD. The oscillating signal received by the fourth oscillating controller 241 may be the fourth oscillating signal ROD4. The fourth oscillating controller 241 may output the fourth oscillating signal ROD4 in the monitoring operation mode of the semiconductor apparatus 100, and output the fourth phase clock signal QBCLK in the normal operation mode of the semiconductor apparatus 100. The fourth delay 242 may generate the fourth output clock signal QBCLKO by delaying the output of the fourth oscillating controller 241. The fourth delay 242 may receive the third delay compensation signal DQBC. The fourth delay 242 may be a variable delay. The delay time and/or delay amount of the variable delay 242 may be adjusted based on the third delay compensation signal DQBC. The fourth clock path 114 may further include a buffer 243 configured to buffer the output of the fourth oscillating controller 241 and an output of the fourth delay 242. The fourth oscillating controller 241 may be configured to perform NAND and inversion operations and may include, for example but not limited to, a NAND gate configured to receive the fourth phase clock signal QBCLK and the fourth oscillating signal ROD4 and an inverter configured to invert an output of the NAND gate.

The oscillating path generation circuit 121 may include a first path selector 251 and a second path selector 252. The first path selector 251 may receive the signals outputted from the first to fourth clock paths 111 to 114, that is, the first to fourth output clock signals ICLK, QCLK, IBCLK and QBCLK. The first path selector 251 may be coupled to one of the output terminals of the first to fourth clock paths 111 to 114 based on an enable signal, and generate the oscillating signal ROD based on a signal outputted from one of the first to fourth clock paths 111 to 114. The first path selector 251 may be coupled to the output terminal of the first clock path 111 based on a first enable signal EN1, and generate the oscillating signal ROD from the first output clock signal ICLKO. The oscillating signal may be the first oscillating signal ROD1. The first path selector 251 may be coupled to the output terminal of the second clock path 112 based on a second enable signal EN2, and generate the oscillating signal ROD from the second output clock signal QCLKO. The oscillating signal may be the second oscillating signal ROD2. The first path selector 251 may be coupled to the output terminal of the third clock path 113 based on a third enable signal EN3, and generate the oscillating signal ROD from the third output clock signal IBCLKO. The oscillating signal may be the third oscillating signal ROD3. The first path selector 251 may be coupled to the output terminal of the fourth clock path 114 based on a fourth enable signal EN4, and generate the oscillating signal ROD from the fourth output clock signal QBCLKO. The oscillating signal may be the fourth oscillating signal ROD4.

The second path selector 252 may receive the oscillating signal ROD, and be coupled to one of the first to fourth clock paths 111 to 114. The second path selector 252 may be coupled to one of the input terminals of the first to fourth clock paths 111 to 114 based on the enable signal. The second path selector 252 may feed back the oscillating signal ROD to one of the first to fourth clock paths 111 to 114. The second path selector 252 may be coupled to the input terminal of the first clock path 111 based on the first enable signal EN1, and feed back the oscillating signal ROD as the first oscillating signal ROD1 to the first clock path 111. The second path selector 252 may be coupled to the input terminal of the second clock path 112 based on the second enable signal EN2, and feed back the oscillating signal ROD as the second oscillating signal ROD2 to the second clock path 112. The second path selector 252 may be coupled to the input terminal of the third clock path 113 based on the third enable signal EN3, and feed back the oscillating signal ROD as the third oscillating signal ROD3 to the third clock path 113. The second path selector 252 may be coupled to the input terminal of the fourth clock path 114 based on the fourth enable signal EN4, and feed back the oscillating signal ROD as the fourth oscillating signal ROD4 to the fourth clock path 114.

The oscillating path generation circuit 121 may further include an inverter 253 and a buffer 254. The inverter 253 may invert an output of the first path selector 251. The buffer 254 may be coupled to the inverter 253, and generate the oscillating signal ROD by buffering an output of the first inverter 253. When the first enable signal EN1 is enabled, the first path selector 251 may coupled to the output terminal of the first clock path 111, and the second path selector 252 may be coupled to the input terminal of the first clock path 111. Thus, the oscillating path generation circuit 121 may form the first oscillating path including the first clock path 111. When the second enable signal EN2 is enabled, the first path selector 251 may coupled to the output terminal of the second clock path 112, and the second path selector 252 may be coupled to the input terminal of the second clock path 112. Thus, the oscillating path generation circuit 121 may form the second oscillating path including the second clock path 112. When the third enable signal EN3 is enabled, the first path selector 251 may coupled to the output terminal of the third clock path 113, and the second path selector 252 may be coupled to the input terminal of the third clock path 113. Thus, the oscillating path generation circuit 121 may form the third oscillating path including the third clock path 113. When the fourth enable signal EN4 is enabled, the first path selector 251 may coupled to the output terminal of the fourth clock path 114, and the second path selector 252 may be coupled to the input terminal of the fourth clock path 114. Thus, the oscillating path generation circuit 121 may form the fourth oscillating path including the fourth clock path 114.

Figure 3:
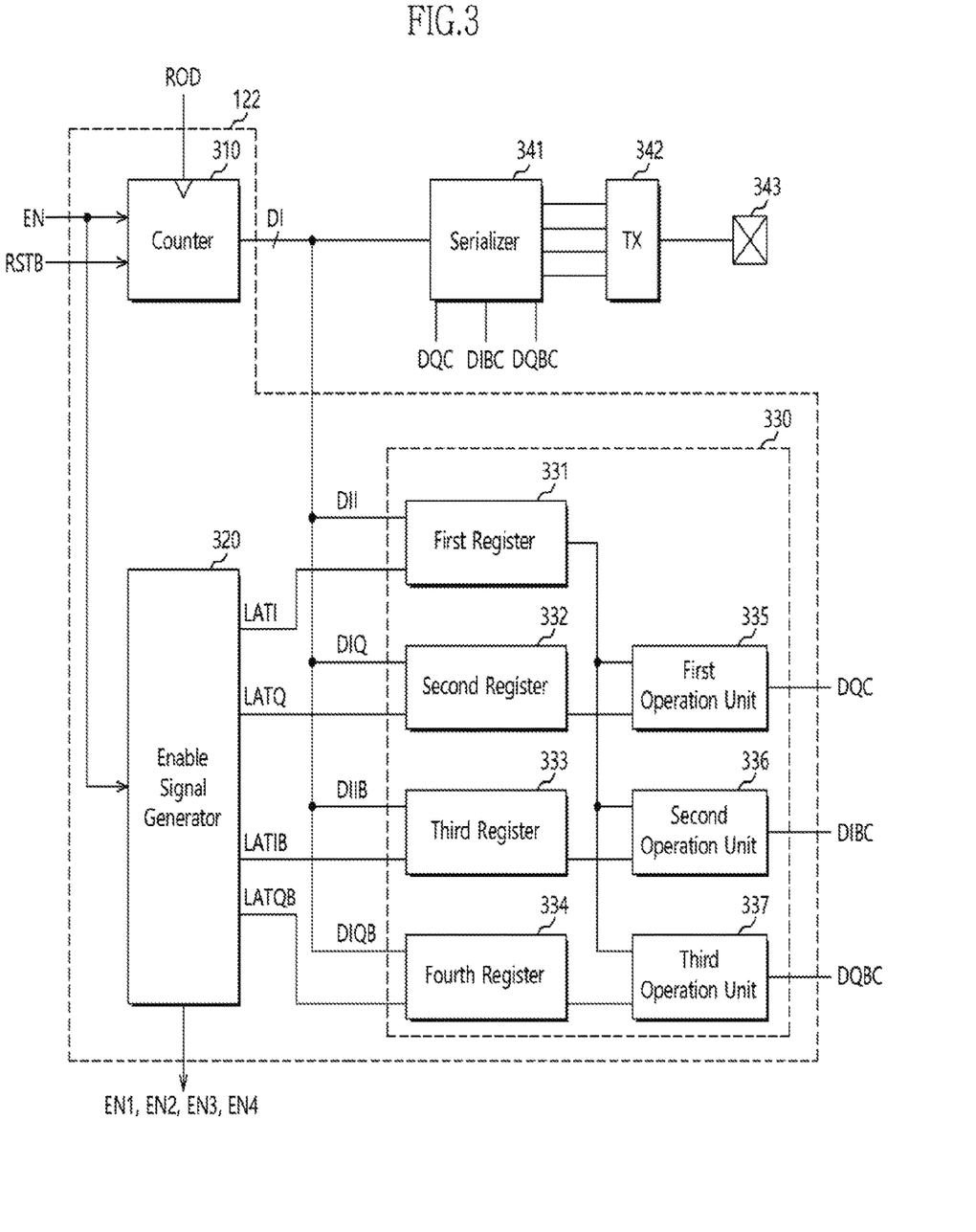
FIG. 3 illustrates a delay information generation circuit of FIG. 1 and some components of the semiconductor apparatus, which may be coupled to the delay information generation circuit.

FIG. 3 illustrates the delay information generation circuit 122 of FIG. 1 and some components of the semiconductor apparatus 100, which may be coupled to the delay information generation circuit 122. Referring to FIG. 3, the delay information generation circuit 122 may include a counter 310, an enable signal generator 320 and a delay compensation signal generator 330. The counter 310 may receive the oscillating signals ROD outputted from the oscillating path generation circuit 121. The counter 310 may receive the enable signal EN. The enable signal EN may be enabled at specific time intervals in the monitoring mode of the semiconductor apparatus 100. For example, the enable signal EN may be generated from the monitoring signal MON illustrated in FIG. 1. The counter 310 may count the enable signal EN as the oscillating signal ROD. The counter 310 may generate a delay information signal DI by counting the oscillating signal ROD in a period where the enable signal EN is enabled. The counter 310 may generate the delay information signal DI by counting the oscillating signal generated through the formation of the first clock path 111 and the oscillating path, i.e. the first oscillating signal ROD1. The delay information signal may be a first delay information signal DII. The first delay information signal DII may serve as a reference delay information signal. The counter 310 may generate the delay information signal DI by counting the oscillating signal generated through the formation of the second clock path 112 and the oscillating path, i.e. the second oscillating signal ROD2. The delay information signal may be a second delay information signal DIQ. The counter 310 may generate the delay information signal DI by counting the oscillating signal generated through the formation of the third clock path 113 and the oscillating path, i.e. the third oscillating signal ROD3. The delay information signal may be a third delay information signal DIIB. The counter 310 may generate the delay information signal DI by counting the oscillating signal generated through the formation of the fourth clock path 114 and the oscillating path, i.e. the fourth oscillating signal ROD4. The delay information signal may be a fourth delay information signal DIQB. The counter 310 may be reset based on a reset signal RSTB, and initialize the delay information signal DI.

The enable signal generator 320 may generate the first to fourth enable signals EN1 to EN4 based on the enable signals EN. The enable signal generator 320 may output the enable signal EN enabled for the first time as the first enable signal EN1. The enable signal generator 320 may output the enable signal EN enabled for the second time as the second enable signal EN2. The enable signal generator 320 may output the enable signal EN enabled for the third time as the third enable signal EN3. The enable signal generator 320 may output the enable signal EN enabled for the fourth time as the fourth enable signal EN4. Furthermore, the enable signal generator 320 may generate a first latch signal LATI, a second latch signal LATQ, a third latch signal LATIB and a fourth latch signal LATQB based on the enable signal EN. The enable signal generator 320 may enable the first latch signal LATI when the first enable signal EN1 is disabled. The enable signal generator 320 may enable the second latch signal LATQ when the second enable signal EN2 is disabled. The enable signal generator 320 may enable the third latch signal LATIB when the third enable signal EN3 is disabled. The enable signal generator 320 may enable the fourth latch signal LATQB when the fourth enable signal EN4 is disabled.

The delay compensation signal generator 330 may receive the delay information signals DI and generate the delay compensation signals. The delay compensation signal generator 330 may generate the first to third delay compensation signals DQC, DIBC and DQBC based on the first to fourth delay information signals DII, DIQ, DIIB and DIQB. The delay compensation signal generator 330 may generate the first delay compensation signal DQC based on the first and second delay information signals DII and DIQ. The delay compensation signal generator 330 may generate the second delay compensation signal DIBC based on the first and third delay information signals DII and DIIB. The delay compensation signal generator 330 may generate the third delay compensation signal DQBC based on the first and fourth delay information signals DII and DIQB.

The delay compensation signal generator 330 may include a first register 331, a second register 332, a third register 333, a fourth register 334, a first operation unit 335, a second operation unit 336 and a third operation unit 337. The first register 331 may receive the delay information signal DI from the counter 310, and receive the first latch signal LATI from the enable signal generator 320. The first register 331 may store the delay information signal DI when the first latch signal LATI is enabled. Therefore, the first register 331 may store the first delay information signal DII. The second register 332 may receive the delay information signal DI from the counter 310, and receive the second latch signal LATQ from the enable signal generator 320. The second register 332 may store the delay information signal DI when the second latch signal LATQ is enabled. Therefore, the second register 332 may store the second delay information signal DIQ. The third register 333 may receive the delay information signal DI from the counter 310, and receive third first latch signal LATIB from the enable signal generator 320. The third register 333 may store the delay information signal DI when the third latch signal LATIB is enabled. Therefore, the third register 333 may store the third delay information signal DIIB. The fourth register 334 may receive the delay information signal DI from the counter 310, and receive the fourth latch signal LATQB from the enable signal generator 320. The fourth register 334 may store the delay information signal DI when the fourth latch signal LATQB is enabled. Therefore, the fourth register 334 may store the fourth delay information signal DIQB.

The first operation unit 335 may receive the first and second delay information signals DII and DIQ stored in the first and second registers 331 and 332. The first operation unit 335 may generate the first delay compensation signal DQC based on the first and second delay information signals DII and DIQ. The first operation unit 335 may generate the first delay compensation signal DQC by performing an operation on the first and second delay information signals DII and DIQ. For example, the operation may be subtraction. The first operation unit 335 may generate the first delay compensation signal DQC by subtracting the second delay information signal DIQ from the first delay information signal DII. Therefore, the first delay compensation signal DQC may have a value corresponding to a difference between the first and second delay information signals DII and DIQ, and include information corresponding to a difference in delay time and/or delay amount between the first and second clock paths 111 and 112.

The second operation unit 336 may receive the first and third delay information signals DII and DIIB stored in the first and third registers 331 and 333. The second operation unit 336 may generate the second delay compensation signal DIBC based on the first and third delay information signals DII and DIIB. The second operation unit 336 may generate the second delay compensation signal DIBC by performing an operation on the first and third delay information signals DII and DIIB. The second operation unit 336 may generate the second delay compensation signal DIBC by subtracting the third delay information signal DIIB from the first delay information signal DII. Therefore, the second delay compensation signal DIBC may have a value corresponding to a difference between the first and third delay information signals DII and DIIB, and include information corresponding to a difference in delay time and/or delay amount between the first and third clock paths 111 and 113.

The third operation unit 337 may receive the first and fourth delay information signals DII and DIQB stored in the first and fourth registers 331 and 334. The third operation unit 337 may generate the third delay compensation signal DQBC based on the first and fourth delay information signals DII and DIQB. The third operation unit 337 may generate the third delay compensation signal DQBC by performing an operation on the first and fourth delay information signals DII and DIQB. The third operation unit 337 may generate the third delay compensation signal DQBC by subtracting the fourth delay information signal DIQB from the first delay information signal DII. Therefore, the third delay compensation signal DQBC may have a value corresponding to a difference between the first and fourth delay information signals DII and DIQB, and include information corresponding to a difference in delay time and/or delay amount between the first and fourth clock paths 111 and 114.

The semiconductor apparatus 100 may further include a serializer 341 and a transmitter 342. The serializer 341 may receive the delay information signal DI from the counter 310. The serializer 341 may convert the delay information signal DI into a serial signal. The transmitter 342 may receive the serial signal from the serializer 341. The transmitter 342 may be coupled to a bus coupled to an external device through a pad 343. The transmitter 342 may drive the bus based on the serial signal. The transmitter 342 may drive the pad 343 to output the delay information signal DI converted into the serial signal to the external device. The pad 343 may be a data pad, for example. The semiconductor apparatus 100 may output the delay information signal DI to the external device through the serializer 341 and the transmitter 342 in the monitoring operation mode. In an embodiment, the serializer 341 may receive the first to third delay compensation signals DQC, DIBC and DQBC. The semiconductor apparatus 100 may output the first to third delay compensation signals DQC, DIBC and DQBC to the external device through the serializer 341 and the transmitter 342 in the monitoring operation mode, instead of the delay information signal DI. In an embodiment, one or more of delay information signals and a delay compensation signal may be outputted through the data pad 343 to an external of the semiconductor apparatus 100. In an embodiment, one or more of delay information signals and a delay compensation signal may be outputted through the data pad 343 and the bus to travel to an external of the semiconductor apparatus 100.

Figure 4:
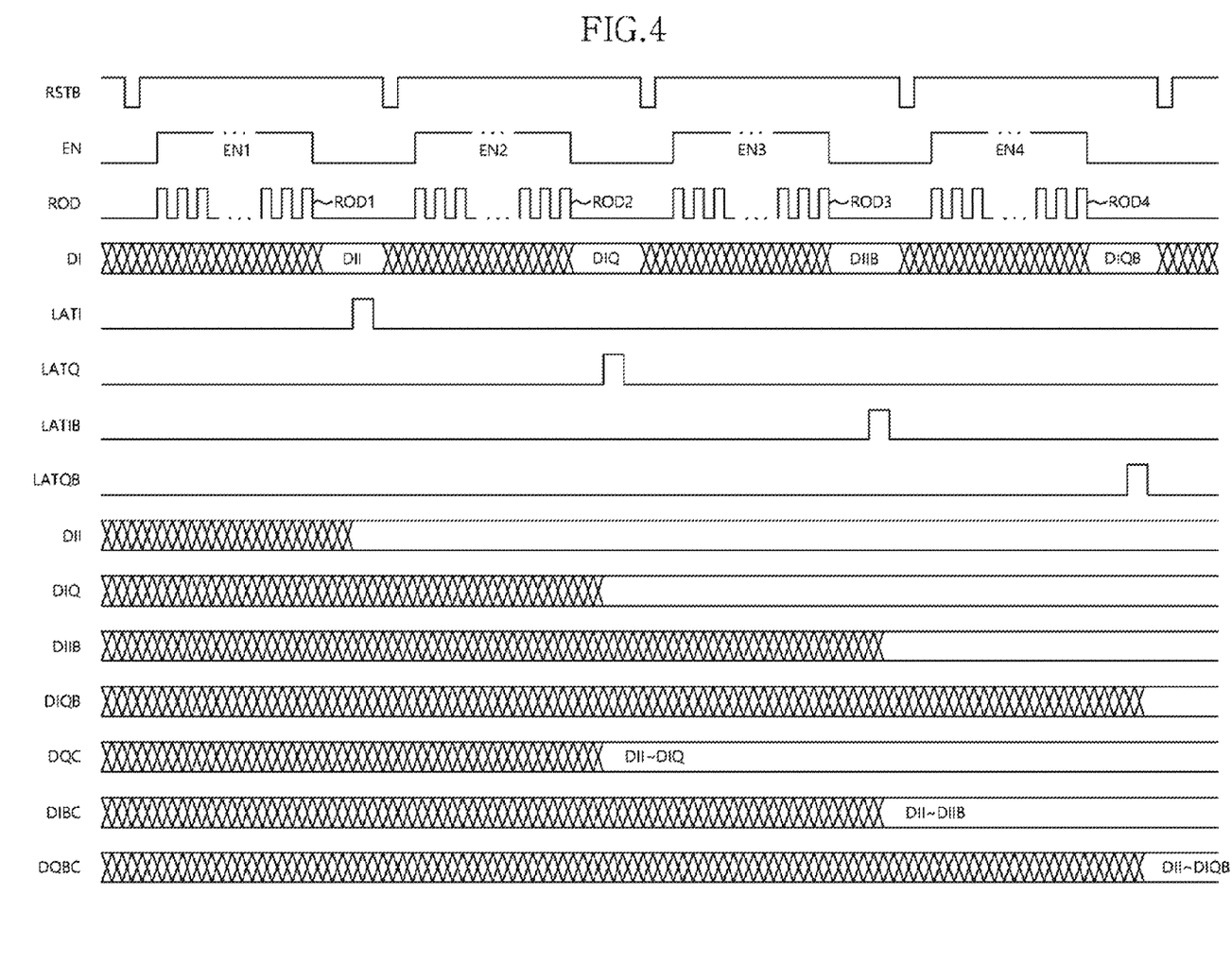
FIG. 4 is a timing diagram illustrating an operation of the semiconductor apparatus in accordance with an embodiment.

FIG. 4 is a timing diagram illustrating an operation of the semiconductor apparatus 100 in accordance with an embodiment. Referring to FIGS. 1 to 4, the operation of the semiconductor apparatus 100 in accordance with an embodiment will be described as follows. When the semiconductor apparatus 100 operates in the monitoring operation mode, the monitoring signal MON may be enabled, and the multiphase clock generation circuit 115 may output a level signal having a logic high level instead of the first to fourth phase clock signals ICLK, QCLK, IBCLK and QBCLK. When the reset signal RSTB is enabled, the counter 310 may be reset. When the enable signal EN is enabled for the first time, the first enable signal EN1 may be enabled, and the oscillating path generation circuit 121 may be coupled to the first clock path 111 and form the first oscillating path including the first clock path 111. The oscillating path generation circuit 121 may form the first oscillating path to generate the first oscillating signal ROD1. The counter 310 may generate the first delay information signal DII by counting the first oscillating signal ROD1 in a period where the first enable signal EN1 is enabled. When the first enable signal EN1 is disabled, the first latch signal LATI may be enabled, and the first register 331 may store the first delay information signal DII. When the first latch signal LATI is disabled, the reset signal RSTB may be enabled, and the counter 310 may be reset.

When the enable signal EN is enabled for the second time, the second enable signal EN2 may be enabled, and the oscillating path generation circuit 121 may be coupled to the second clock path 112 and form the second oscillating path including the second clock path 112. The oscillating path generation circuit 121 may form the second oscillating path to generate the second oscillating signal ROD2. The counter 310 may generate the second delay information signal DIQ by counting the second oscillating signal ROD2 in a period where the second enable signal EN2 is enabled. When the second enable signal EN2 is disabled, the second latch signal LATQ may be enabled, and the second register 332 may store the second delay information signal DIQ. When the second latch signal LATQ is disabled, the reset signal RSTB may be enabled, and the counter 310 may be reset. The first operation unit 335 may generate the first delay compensation signal DQC by performing an operation on the first delay information signal DII and the second delay information signal DIQ. The first delay compensation signal DQC may be provided to the second delay 222 of the second clock path 112. The delay time and/or delay amount of the second clock path 112 may be increased or decreased based on the first delay compensation signal DQC, and the second clock path 112 may be configured to have substantially the same delay time and/or delay amount as the first clock path 111.

When the enable signal EN is enabled for the third time, the third enable signal EN3 may be enabled, and the oscillating path generation circuit 121 may be coupled to the third clock path 113 and form the third oscillating path including the third clock path 113. The oscillating path generation circuit 121 may form the third oscillating path to generate the third oscillating signal ROD3. The counter 310 may generate the third delay information signal DIIB by counting the third oscillating signal ROD3 in a period where the third enable signal EN3 is enabled. When the third enable signal EN3 is disabled, the third latch signal LATIB may be enabled, and the third register 333 may store the third delay information signal DIIB. When the third latch signal LATIB is disabled, the reset signal RSTB may be enabled, and the counter 310 may be reset. The second operation unit 336 may generate the second delay compensation signal DIBC by performing an operation on the first delay information signal DII and the third delay information signal DIIB. The second delay compensation signal DIBC may be provided to the third delay 232 of the third clock path 113. The delay time and/or delay amount of the third clock path 113 may be increased or decreased based on the second delay compensation signal DIBC, and the third clock path 113 may be configured to have substantially the same delay time and/or delay amount as the first clock path 111.

When the enable signal EN is enabled for the fourth time, the fourth enable signal EN4 may be enabled, and the oscillating path generation circuit 121 may be coupled to the fourth clock path 114 and form the fourth oscillating path including the fourth clock path 114. The oscillating path generation circuit 121 may form the fourth oscillating path to generate the fourth oscillating signal ROD4. The counter 310 may generate the fourth delay information signal DIQB by counting the fourth oscillating signal ROD4 in a period where the fourth enable signal EN4 is enabled. When the fourth enable signal EN4 is disabled, the fourth latch signal LATQB may be enabled, and the fourth register 334 may store the fourth delay information signal DIQB. When the fourth latch signal LATQB is disabled, the reset signal RSTB may be enabled, and the counter 310 may be reset. The third operation unit 337 may generate the third delay compensation signal DQBC by performing an operation on the first delay information signal DII and the fourth delay information signal DIQB. The third delay compensation signal DQBC may be provided to the fourth delay 242 of the fourth clock path 114. The delay time and/or delay amount of the fourth clock path 114 may be increased or decreased based on the third delay compensation signal DQBC, and the fourth clock path 114 may be configured to have substantially the same delay time and/or delay amount as the first clock path 111.

Figure 5:
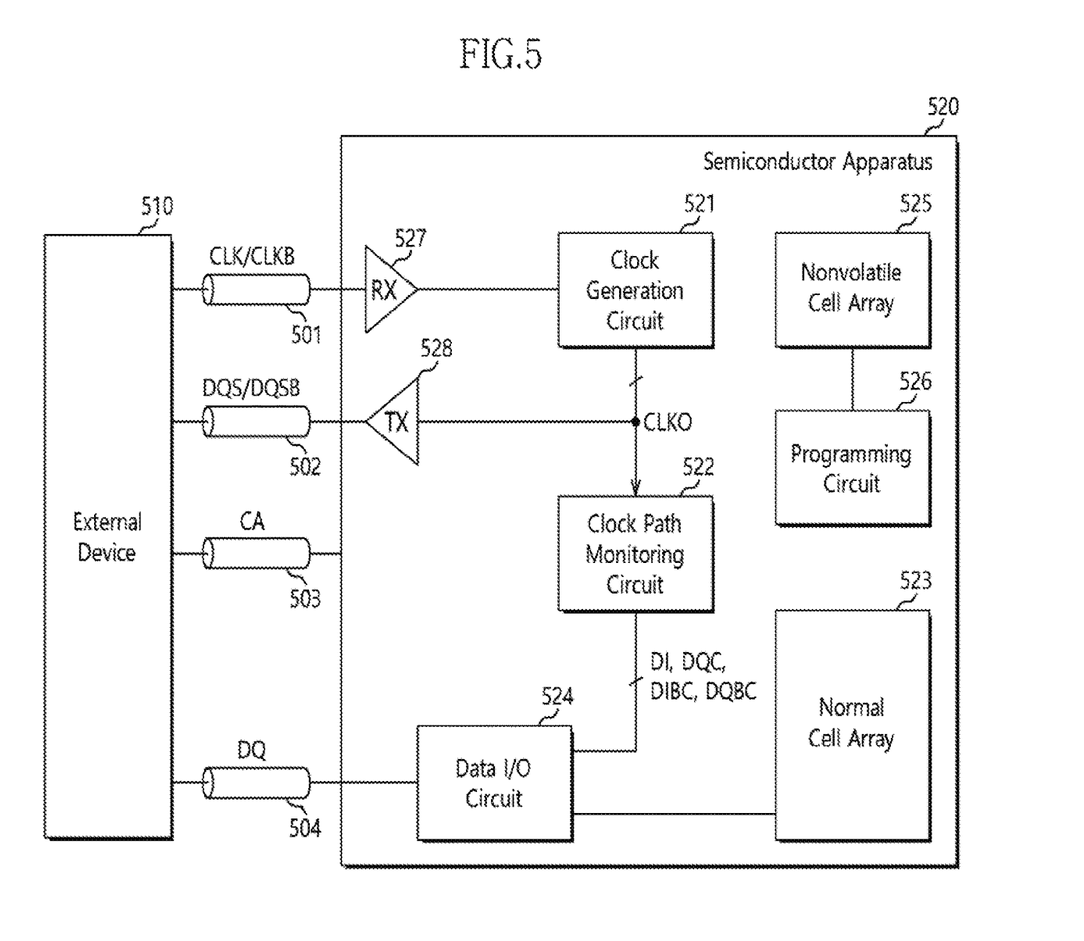
FIG. 5 illustrates a configuration of a semiconductor system in accordance with an embodiment.

FIG. 5 illustrates a configuration of a semiconductor system 5 in accordance with an embodiment. Referring to FIG. 5, the semiconductor system 5 may include an external device 510 and a semiconductor apparatus 520. The external device 510 may provide various control signals for operations of the semiconductor apparatus 520. The external device 510 may include various types of devices. For example, the external device 510 may be a host device such as a central processing unit (CPU), graphic processing unit (GPU), multi-media processor (MMP), digital signal processor, application processor (AP) or memory controller. Furthermore, the external device 510 may be a test device or test equipment for testing the semiconductor apparatus 520. The semiconductor apparatus 520 may be a memory device, for example, and the memory device may include a volatile memory and a nonvolatile memory. The volatile memory may include an SRAM (Static RAM), DRAM (Dynamic RAM) and SDRAM (Synchronous DRAM), and the nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), FRAM (Ferroelectric RAM) and the like.

The semiconductor apparatus 520 may be coupled to the external device 510 through a plurality of buses. The plurality of buses 101 may be signal transfer paths, links or channels for transferring a signal. The plurality of buses may include a clock bus 501, a data strobe bus 502, a command address bus 503, a data bus 504 and the like. The clock bus 501 and the command address bus 503 may be one-way buses, and the data bus 504 may be a two-way bus. The data strobe bus 502 may be a one-way bus or two-way bus. The semiconductor apparatus 520 may be coupled to the external device 510 through the clock bus 501, and receive a system clock signal CLK through the clock bus 501. The system clock signal CLK may be transferred as a single ended signal, or transferred as a differential signal with a complementary signal CLKB. The semiconductor apparatus 520 may receive a data strobe signal DQS transferred from the external device 510 through the data strobe bus 502, or transfer the data strobe signal DQS to the external device 510. The data strobe signal DQS may be transferred as a differential signal with the complementary signal DQSB. The semiconductor apparatus 520 may receive a command address signal CA from the external device 510 through the command address bus 503. The semiconductor apparatus 520 may be coupled to the external device 510 through the data bus 504, and receive data DQ from the external device 510 or transfer the data DQ to the external device 510 through the data bus 504.

The semiconductor apparatus 520 may include a clock generation circuit 521, a clock path monitoring circuit 522, a normal cell array 523, a data I/O circuit 524, a nonvolatile cell array 525 and a programming circuit 526. The clock generation circuit 521 may be coupled to the clock bus 501, and receive the system clock signal CLK through a clock receiver 527. The clock generation circuit 521 may generate a multi-phase clock signal based on the system clock signal CLK, and generate a plurality of output clock signals CLKO by delaying the multi-phase clock signal. The clock generation circuit 521 may include a plurality of clock paths for delaying the multi-phase clock signal. The output clock signal CLKO generated from the clock generation circuit 521 may be outputted as the data strobe signal DQS to the data strobe bus 502 through a clock transmitter 528. The clock generation circuit 110 illustrated in FIG. 1 may be applied as the clock generation circuit 521.

The clock path monitoring circuit 522 may be coupled to the clock generation circuit 521, measure delay times and/or delay amounts of the plurality of clock paths of the clock generation circuit 521, and set the delay times and/or delay amounts of the plurality of clock paths to the same delay time and/or delay amount according to the measured result. The clock path monitoring circuit 522 may generate a delay information signal DI and delay compensation signals DQC, DIBC and DQBC, the delay information signal DI having delay information on the plurality of clock paths. The clock path monitoring circuit 120 illustrated in FIG. 1 may be applied as the clock path monitoring circuit 522.

The normal cell array 523 may include a plurality of memory cells. The normal cell array 523 may include a plurality of bit lines and a plurality of word lines, and the plurality of memory cells may be coupled to the respective intersections between the plurality of bit lines and the plurality of word lines. The data I/O circuit 524 may be coupled to the data bus 504. The data I/O circuit 524 may store the data DQ transferred through the data bus 504 from the external device 510 into the normal cell array 523 in a normal operation mode of the semiconductor apparatus 520. The data I/O circuit 524 may output the data stored in the normal cell array 523 to the external device 510 through the data bus 504. The data I/O circuit 524 may receive the delay information signal DI and the delay compensation signals DQC, DIBC and DQBC which are generated from the clock path monitoring circuit 522, in a monitoring operation mode of the semiconductor apparatus 520. The data I/O circuit 524 may output the delay information signal DI and the delay compensation signals DQC, DIBC and DQBC to the external device 510 through the data bus 504. The serializer 341 and the transmitter 342, which are illustrated in FIG. 3, may be applied as components of the data I/O circuit 524. In some embodiments, the serializer 341, the transmitter 342 and the pad 343, which are illustrated in FIG. 3, may be applied as components of the data I/O circuit 524. In some embodiments, the semiconductor apparatus 520 may receive the system clock signal CLK externally from the semiconductor apparatus 520 through a clock bus 501 with the clock receiver 527. In some embodiments, the semiconductor apparatus 520 may transmit the output clock signal CLKO to an external of the semiconductor apparatus 520 via the clock transmitter 528 to data strobe bus 502. In some embodiments, the semiconductor apparatus 520 may output the delay information signal DI and the delay compensation signals DQC, DIBC and DQBC to an external of the semiconductor apparatus 520 via the data I/O circuit 524 to the data bus 504.

The nonvolatile cell array 525 may include a plurality of nonvolatile memory cells. The nonvolatile memory cells may be one time programmable (OTP) memory cells. In an embodiment, the nonvolatile memory cell may include a fuse. The fuse may be a programmable electrical fuse. The nonvolatile cell array 525 may be an electrical fuse array. The programming circuit 526 may receive the command address signal CA from the external device 510 through the command address bus 503. The programming circuit 526 may program the nonvolatile cell array 525 based on the command address signal CA.

The semiconductor apparatus 520 may output the delay compensation signals DQC, DIBC and DQBC to the external device 510 through the data I/O circuit 524 in the monitoring operation mode. The external device 510 may generate the command address signal CA based on the delay compensation signals DQC, DIBC and DQBC. The programming circuit 526 of the semiconductor apparatus 520 may program information corresponding to the delay compensation signals DQC, DIBC and DQBC to the nonvolatile cell array 525 based on the command address signal CA. The information stored in the nonvolatile cell array 525 may be provided to the clock generation circuit 521, and the delay time and/or delay amount of the clock path constituting the clock generation circuit 521 may be set based on the information provided from the nonvolatile cell array 525.

While various embodiments have been described above, it will be understood to those skilled in the art that the embodiments described are examples only. Accordingly, the semiconductor apparatus and the semiconductor system which are described herein should not be limited based on the described embodiments.

What is claimed is:

1. A semiconductor apparatus comprising:
 a first clock path configured to generate a first output clock signal by delaying a first phase clock signal;
 a second clock path configured to generate a second output clock signal by delaying a second phase clock signal based on a delay compensation signal;
 an oscillating path generation circuit configured to form a first oscillating path with the first clock path to generate a first oscillating signal, and form a second oscillating path with the second clock path to generate a second oscillating signal; and
 a delay information generation circuit configured to generate the delay compensation signal based on the first and second oscillating signals,
 wherein the first clock path comprises:
 a first oscillating controller configured to receive the first phase clock signal and the first oscillating signal; and
 a first delay configured to generate the first output clock signal by delaying an output of the first oscillating controller by a reference time.

2. The semiconductor apparatus according to claim 1, wherein the second phase clock signal has a phase difference corresponding to a unit phase from the first phase clock signal.

3. The semiconductor apparatus according to claim 1, wherein the second clock path comprises:
 a second oscillating controller configured to receive the second phase clock signal and the second oscillating signal; and
 a second delay configured to generate the second output clock signal by delaying an output of the second oscillating controller,
 wherein the second delay has a delay amount that is decided based on a delay compensation signal.

4. The semiconductor apparatus according to claim 3, wherein the oscillating path generation circuit comprises:
 a first path selector configured to output one of the first and second output clock signals based on an enable signal; and
 a second path selector configured to provide the output of the first path selector as one of the first and second oscillating signals based on the enable signal.

5. The semiconductor apparatus according to claim 1, wherein the delay information generation circuit comprises:
 a counter configured to generate a delay information signal by counting the first and second oscillating signals during an enable period of an enable signal; and
 a delay compensation signal generator configured to generate the delay compensation signal based on the delay information signal which is generated based on the first oscillating signal and the delay information signal which is generated based on the second oscillating signal.

6. The semiconductor apparatus according to claim 5, wherein the delay compensation signal generator comprises:

a first register configured to store the delay information signal as a first delay information signal based on a first enable signal;

a second register configured to store the delay information signal as a second delay information signal based on a second enable signal; and an operation unit configured to generate the delay compensation signal by performing an operation on the first and second delay information signals.

7. The semiconductor apparatus according to claim 1, wherein the first and second phase clock signals are generated based on a system clock signal, and fixed to a specific level based on a monitoring signal.

8. The semiconductor apparatus according to claim 1, further comprising a nonvolatile cell array configured to store information corresponding to the delay compensation signal.

9. The semiconductor apparatus according to claim 1, wherein one or more of the delay information signal and the delay compensation signal are outputted through a data pad to an external of the semiconductor apparatus.

10. An operating method of a semiconductor system which comprises a semiconductor apparatus including a first clock path configured to generate a first output clock signal by delaying a first phase clock signal and a second clock path configured to generate a second output clock signal by delaying a second phase clock signal, the operating method comprising:

forming a first oscillating path with the first clock path, and generating a first delay information signal corresponding to a delay amount of the first oscillating path;

forming a second oscillating path with the second clock path, and generating a second delay information signal corresponding to a delay amount of the second oscillating path;

generating a delay compensation signal by performing an operation on the first and second delay information signals; and setting a delay amount of the second clock path based on the delay compensation signal, wherein the semiconductor system further comprises an external device, and wherein the operating method further comprises outputting the delay compensation signal to the external device after generating the delay compensation signal.

11. The operating method according to claim 10, further comprising:

generating, by the external device, a command address signal based on the delay compensation signal, and transferring the command address signal to the semiconductor apparatus; and programming, by the semiconductor apparatus, a nonvolatile cell array based on the command address signal.

12. A semiconductor system comprising:

an external device configured to generate a system clock signal; and a semiconductor apparatus configured to receive the system clock signal from the external device, wherein the semiconductor apparatus comprises:

a multi-phase clock generation circuit configured to generate a first phase clock signal and a second phase clock signal based on the system clock signal;

a first clock path configured to generate the first output clock signal by delaying the first phase clock signal;

a second clock path configured to generate a second output clock signal by delaying the second phase clock signal based on a delay compensation signal; and a clock path monitoring circuit configured to form an oscillating path with the first clock path to generate a first delay information signal, form the oscillating path with the second clock path to generate a second delay information signal, and generate the delay compensation signal based on the first and second delay information signals.

13. The semiconductor system according to claim 12, wherein the second phase clock signal has a phase difference corresponding to a unit phase from the first phase clock signal.

14. The semiconductor system according to claim 12, wherein the multi-phase clock generation circuit receives a monitoring signal, and fixes the first and second phase clock signals to a specific level based on the monitoring signal.

15. The semiconductor system according to claim 12, wherein the clock path monitoring circuit comprises:

an oscillating path generation circuit configured to generate a first oscillating signal by forming the oscillating path with the first clock path based on a first enable signal, and generate a second oscillating signal by forming the oscillating path with the second clock path based on a second enable signal; and a delay information generation circuit configured to generate the first delay information signal by counting the first oscillating signal, generate the second delay information signal by counting the second oscillating signal, and generate the delay compensation signal based on the first and second delay information signals.

16. The semiconductor system according to claim 15, wherein the oscillating path generation circuit comprises:

a first path selector configured to receive the first and second output clock signals, output the first output clock signal as the first oscillating signal based on the first enable signal, and output the second output clock signal as the second oscillating signal based on the second enable signal; and a second path selector configured to output the first oscillating signal to the first clock path based on the first enable signal, and output the second oscillating signal to the second clock path based on the second enable signal.

17. The semiconductor system according to claim 15, wherein the delay information generation circuit comprises:

a counter configured to generate the first delay information signal by counting an enable signal as the first oscillating signal, and generate the second delay information signal by counting the enable signal as the second oscillating signal;

an enable signal generator configured to generate the first and second enable signals based on the enable signal; and a delay compensation signal generator configured to generate the delay compensation signal by performing an operation on the first and second delay information signals.

18. The semiconductor system according to claim 17, wherein the delay compensation signal generator comprises:

a first register configured to store the first delay information signal based on the first enable signal;

a second register configured to store the second delay information signal based on the second enable signal; and an operation unit configured to generate the delay compensation signal by performing an operation on the first and second delay information signals.

19. The semiconductor system according to claim 12, wherein the semiconductor apparatus outputs the first and second delay information signals to the external device.

20. The semiconductor system according to claim 12, wherein the semiconductor apparatus outputs the delay compensation signal to the external device.

21. The semiconductor system according to claim 20, wherein the external device generates a command address signal based on the delay compensation signal.

22. The semiconductor system according to claim 21, wherein the semiconductor apparatus further comprises a nonvolatile cell array, and the semiconductor apparatus stores information corresponding to the delay compensation signal in the nonvolatile cell array based on the command address signal.

* * * * *